(12) United States Patent
Werner et al.

(10) Patent No.: US 10,554,212 B2
(45) Date of Patent: Feb. 4, 2020

(54) VOLTAGE-TO-CURRENT CONVERSION

(71) Applicant: SOCIONEXT INC., Yokohama-shi, Kanagawa (JP)

(72) Inventors: Frank Werner, Braunschweig (DE); Uwe Zillmann, Braunschweig (DE); Guido Dröge, Braunschweig (DE); André Schäfer, Braunschweig (DE)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/243,990

(22) Filed: Jan. 9, 2019

(65) Prior Publication Data
US 2019/0229738 A1   Jul. 25, 2019

(30) Foreign Application Priority Data
Jan. 19, 2018 (EP) .................................. 18152593

(51) Int. Cl.
*H03M 1/12* (2006.01)
*H03M 1/00* (2006.01)
*H03F 3/45* (2006.01)
*H03F 1/02* (2006.01)

(52) U.S. Cl.
CPC .......... *H03M 1/002* (2013.01); *H03F 1/0205* (2013.01); *H03F 3/45179* (2013.01); *H03F 3/45713* (2013.01); *H03F 3/45717* (2013.01); *H03F 2200/129* (2013.01); *H03F 2203/45008* (2013.01); *H03F 2203/45078* (2013.01); *H03F 2203/45116* (2013.01); *H03F 2203/45151* (2013.01); *H03F 2203/45258* (2013.01); *H03F 2203/45306* (2013.01); *H03F 2203/45418* (2013.01); *H03F 2203/45431* (2013.01); *H03F 2203/45642* (2013.01)

(58) Field of Classification Search
CPC ....... H03M 1/002; H03M 1/12; H03F 1/0205; H03F 3/45179; H03F 2203/45151; H03F 2203/45116; H03F 2203/45258; H03F 2200/129
USPC ......................................................... 341/155
See application file for complete search history.

(56) References Cited

U.S. PATENT DOCUMENTS

| | | | | |
|---|---|---|---|---|
| 2,543,819 A | * | 3/1951 | Williams | .................. H03F 3/36 330/117 |
| 3,242,417 A | * | 3/1966 | Bertschi | .................... H02P 9/26 322/25 |
| 4,675,594 A | * | 6/1987 | Reinke | .................... G05F 1/561 323/317 |
| 5,519,309 A | | 5/1996 | Smith | |
| 6,639,456 B2 | * | 10/2003 | Paulus | .................... H03F 3/265 323/315 |
| 6,867,618 B2 | * | 3/2005 | Li | ....................... H03F 3/45237 326/115 |

(Continued)

OTHER PUBLICATIONS

Extended European Search Report issued in corresponding European Patent Application No. 18152593.2 dated Jun. 5, 2018.

*Primary Examiner* — Jean B Jeanglaude
(74) *Attorney, Agent, or Firm* — Arent Fox LLP

(57) ABSTRACT

Circuitry for voltage-to-current conversion, and in particular to differential voltage-to-current conversion circuitry. Such circuitry is operable to receive a differential voltage input signal and output a corresponding differential current signal. First and second controllable current sinks are connected to first and second load nodes of the circuitry so as to draw corresponding sink currents from those nodes.

14 Claims, 10 Drawing Sheets

(56) References Cited

U.S. PATENT DOCUMENTS

| | | | |
|---|---|---|---|
| 7,532,045 B1 | 5/2009 | Mulders | |
| 8,648,624 B2 | 2/2014 | Yamada | |
| 9,665,116 B1 | 5/2017 | Arnold et al. | |
| 2005/0225468 A1* | 10/2005 | Cosand | H03M 1/145 |
| | | | 341/155 |
| 2013/0249633 A1 | 9/2013 | Mehrabi et al. | |
| 2016/0079942 A1 | 3/2016 | Li et al. | |
| 2016/0156291 A1* | 6/2016 | Becker | H02M 7/68 |
| | | | 318/400.26 |

* cited by examiner

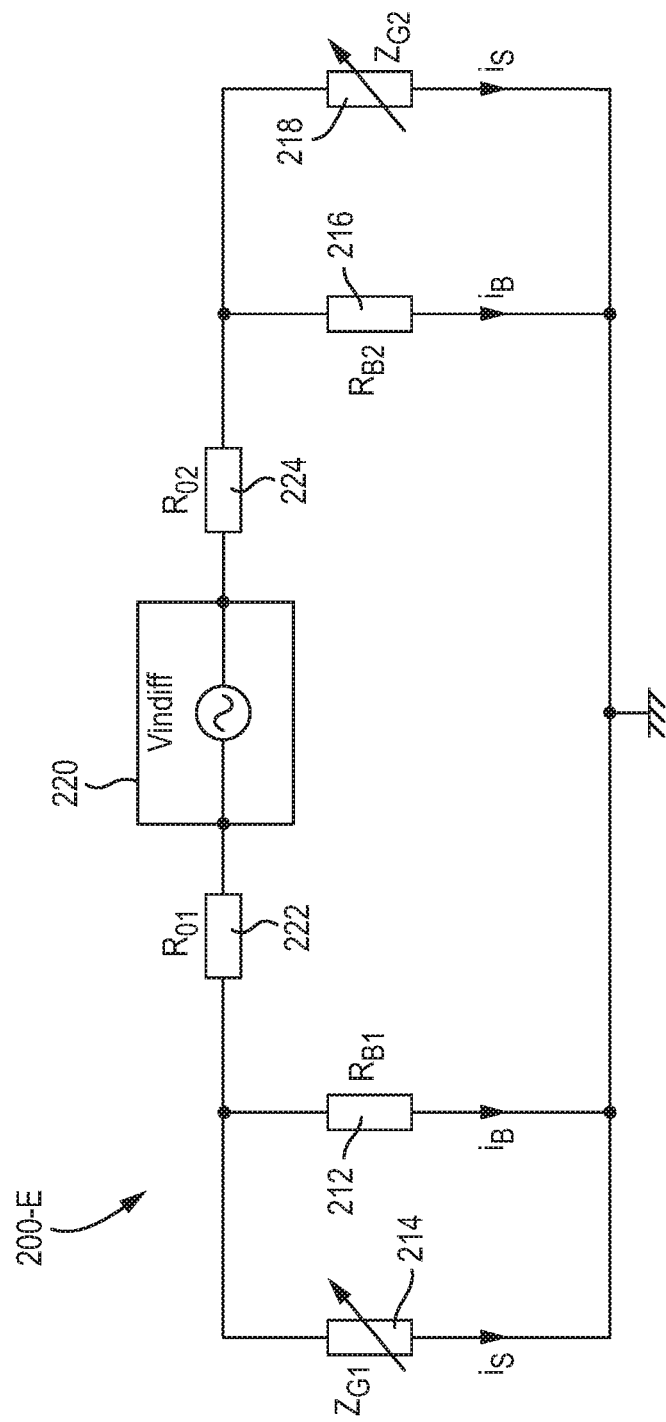

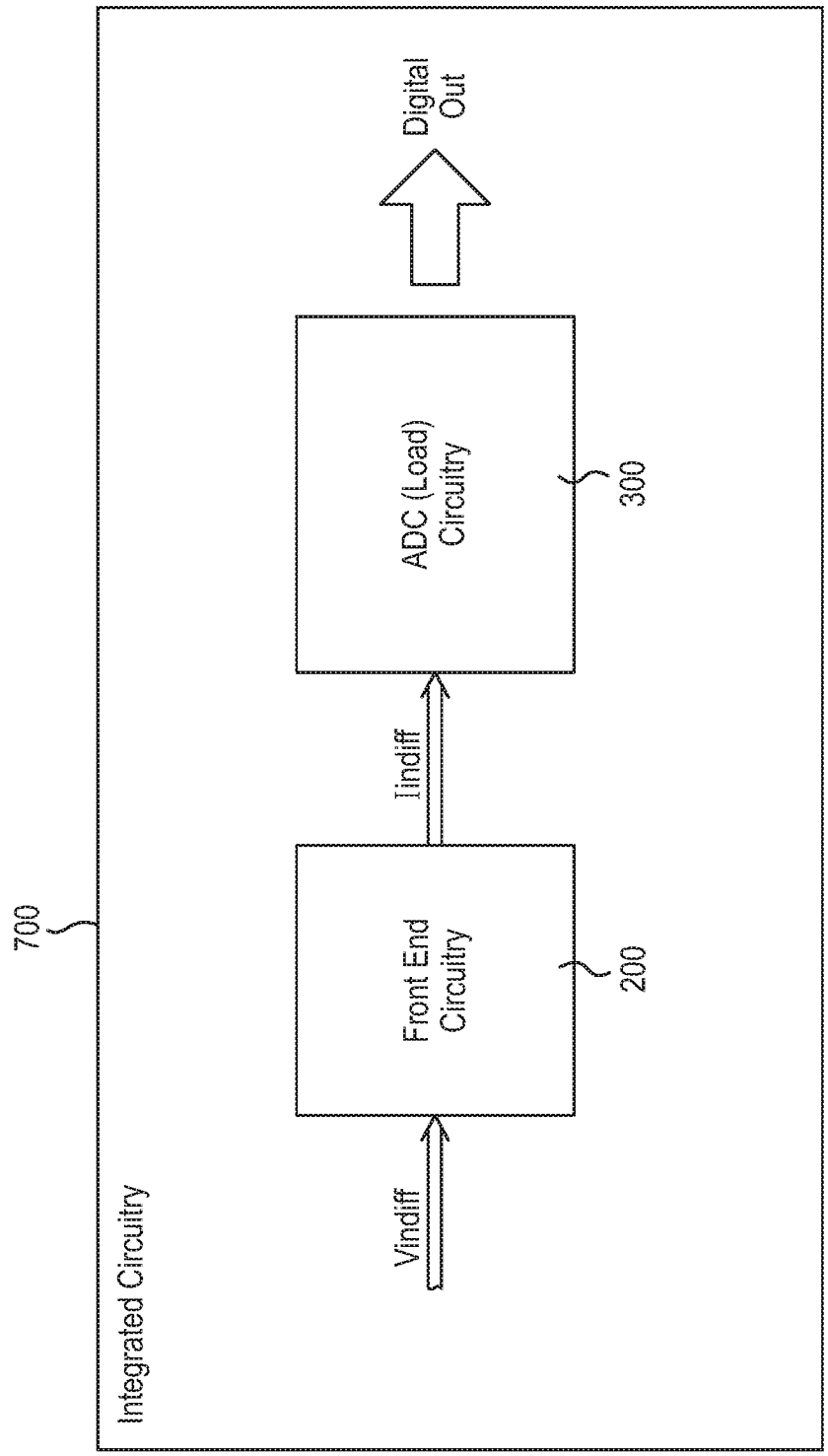

VOLTAGE-TO-CURRENT CONVERSION

CROSS-REFERENCE TO RELATED APPLICATION

This application claims priority from European Patent Application No, 1815259 filed Jan. 19, 2018. The entire contents of the prior application a herein by reference.

The present invention relates to circuitry for voltage-to-current conversion, and in particular to differential voltage-to-current conversion circuitry. Such circuitry is operable to receive a differential voltage input signal and output a corresponding differential current signal.

To understand the potential use of differential voltage-to-current conversion circuitry, FIG. 1A is a schematic circuit diagram of a four-phase (i.e. multiphase) current-mode (current-steering) sampler 42 corresponding closely to FIG. 10 in EP-A1-2211468, and is merely one example of circuitry which is configured to operate based on a differential current signal.

The current-mode sampler 42 is configured to sample a differential input signal, current $I_{IN}$, as shown, by dividing the component current signals (at tail nodes 60 and 66 as described later) into a series of current pulses (samples) which can then be converted into representative digital values to perform an overall analogue-to-digital conversion function. For further detail, reference may be made to EP-A1-2211468.

The sampler 42 is configured to receive the differential input current signal, modeled here as a current source $I_{IN}$ by way of the currents at tail nodes 60 and 66 whose magnitudes vary with $I_{IN}$. Because of the differential signaling, sampler 42 effectively has two matching (or corresponding or complementary) sections 54 and 56 for the two differential inputs, shown here also including circuitry which provides the currents at tail nodes 60 and 66 based on $I_{IN}$ to help in an understanding. Accordingly, there is a first set of output streams $IOUT_A$ to $IOUT_D$ in section 54 and a second set of matching output streams $IOUTB_A$ to $IOUTB_D$, where IOUTB means $\overline{IOUT}$, and wherein $IOUT_A$ is paired with $IOUTB_A$, $IOUT_B$ is paired with $IOUTB_B$, and so on and so forth.

Focusing on the first section 54 by way of example (because the second section 56 operates analogously to the first section 54), there are provided four n-channel MOSFETs $58_A$ to $58_D$ (i.e. one per stream or path) with their source terminals connected together at a common tail node 60.

The aforementioned current source $I_{IN}$ is connected between the common tail node 60 and an equivalent common tail node 66 of section 56. A further current source $I_{DC}$ 62 is connected between the common tail node 60 and ground supply, and carries a constant DC current $I_{DC}$. These current sources could be considered external to the sampler 42 as indicated in FIG. 1A, and used to provide the currents at tail nodes 60 and 66. The gate terminals of the four transistors $58_A$ to $58_D$ are driven by the four clock signals $\theta_0$ to $\theta_3$, respectively, provided e.g. from a VCO (Voltage-Controlled Oscillator).

As mentioned above, section 56 is structurally similar to section 54 and thus comprises transistors $64_A$ to $64_D$, the common tail node 66 and current source $I_{DC}$ 68.

FIG. 2 shows schematic waveforms for the clock signals $\theta_0$ to $\theta_3$ in the upper graph, and schematic waveforms for the corresponding output currents $IOUT_A$ to $IOUT_D$ in the lower graph.

The clock signals $\theta_0$ to $\theta_3$ are time-interleaved raised cosine waveforms provided as four voltage waveforms from the VCO. The use of four clock signals in the present case is due to the four-way-interleaving design of ADC circuitry 40, but it will be appreciated that, in another arrangement, two or more time-interleaved clock signals could be used, for a two-or-more-way split of the input current signal.

Clock signals $\theta_0$ to $\theta_3$ are 90° out of phase with one another, such that $\theta_0$ is at 0° phase, $\theta_1$ is at 90° phase, $\theta_2$ is at 180° phase, and $\theta_3$ is at 270° phase.

The effect of sampling circuitry 42, under control of clock signals $\theta_0$ to $\theta_3$, is that the output currents $IOUT_A$ to $IOUT_D$ are four trains (or streams) of current pulses, the series of pulses in each train having the same period as one of the clock signals $\theta_0$ to $\theta_3$, and the pulses of all four trains together being time-interleaved with one another as an effective overall train of pulses at a quarter of the period of one of the clock signals (or at four times the sampling frequency of one of the clock signals).

The sampler thus operates in the current domain, i.e. effectively as the sampling stage of a current-mode ADC. For further detail, reference may be made again to EP-A1-2211468. As a result, the input signal required is a current signal. However, typical signals that require use of an ADC or sampler are voltage-domain signals, in which the variable under examination is a voltage rather than a current.

FIG. 3 is a schematic circuit diagram of an example implementation 102 of sampling circuitry (sampler) 42, with additional differential voltage-to-current conversion circuitry to which it is possible to apply an input differential voltage signal so as to arrive at the currents at tail nodes 60 and 66.

Implementation 102, similarly to circuitry 42, comprises two sections 54 and 56 for the so-called "plus" and "minus" components of the differential signals. Section 54 comprises switching transistors $58_A$ to $58_D$ connected to common tail node 60, and section 56 comprises switching transistors $64_A$ to $64_D$ connected to common tail node 66, as before.

Implementation 102 basically works by receiving the input voltage signal and by employing resistances to passively convert the received input voltage signal into an equivalent input current signal. Implementation 102 therefore comprises input terminals 104 (VINP) and 106 (VINM) to receive the "plus" and "minus" components of the input voltage signal, respectively.

Input terminals 104 and 106 are each connected to a shared terminal 108 via a resistor 110 and an inductor 112. Input terminals 104 and 106 are further each connected to their corresponding common tail nodes 60 and 66 via a resistor 114. Shared terminal 108 is connected via shared DC current source 116 to a reference potential whose voltage level is below that of VINP and VINM, and may indeed be negative.

An example set of resistance values are shown in FIG. 3. These values have been chosen assuming an example design objective that the input impedance looking into each of the common tail nodes 60 and 66 towards the switching transistors (sampler switches) is 50Ω, and that the input impedance looking into each of the input terminals 104 and 106 is also 50Ω as shown in FIG. 3.

Unfortunately, there are disadvantages associated with the example circuitry used for voltage-to-current conversion shown in FIG. 3. The voltage-to-current conversion is considered relatively inefficient in some applications which limits the resolution of overall ADC circuitry employing the sampler 42. Further, the gain associated with the conversion may not be optimal in some applications.

It is desirable to solve some or all of the above problems.

According to an embodiment of a first aspect of the present invention, there is provided differential voltage-to-current conversion circuitry, comprising: a power supply node for connection to a power supply voltage source; a first current path extending from the power supply node via a first intermediate node to a first load node to provide a first load current at the first load node for use by load circuitry when connected to the first load node, wherein a first supply-connection impedance is connected along the first current path between the power supply node and the first intermediate node and a first load-connection impedance is connected along the first current path between the first intermediate node and the first load node; a second current path extending, in parallel with the first current path, from the power supply node via a second intermediate node to a second load node to provide a second load current at the second load node for use by the load circuitry when connected to the second load node, wherein a second supply-connection impedance is connected along the second current path between the power supply node and the second intermediate node and a second load-connection impedance is connected along the second current path between the second intermediate node and the second load node; a differential voltage input connected between the first and second intermediate nodes via first and second input-connection impedances, respectively, for application of a differential input voltage signal, supplied at the differential voltage input, between the first and second input-connection impedances so that the first and second load currents together define a differential current signal dependent on the differential input voltage signal; and control circuitry, wherein: the first and second load-connection impedances are implemented as first and second transistors, respectively; and the control circuitry is configured to control a bias voltage provided to the gate or base terminals of the first and second transistors so as to control a gain relationship between the differential input voltage signal and the differential current signal.

Such curcuitry exhibits highly linear voltage-to-current conversion, highly efficient signal power conversion by means of highly-controlled input impedance, direct signal current feedthrough from the first and second current paths to subsequent load circuitry, and adjustable gain of the swing of the differential input voltage signal to the swing of the differential current signal.

The control circuitry may be configured to control the bias voltage provided to the gate or base terminals of the first and second transistors based on a common-mode voltage indicative of a common mode between the source or emitter voltages of the first and second transistors.

The control circuitry may comprise first and second measurement impedances connected in series between the source or emitter terminals of the first and second transistors, and may be configured to obtain the common-mode voltage from a node between the first and second measurement impedances.

The first and second measurement impedances may be implemented as resistors. The first and second measurement impedances may have the same impedance (e.g. resistance) as one another.

The control circuitry may be configured to control the bias voltage provided to the gate or base terminals of the first and second transistors based on a difference between the common-mode voltage and a target voltage.

The control circuitry may be configured to control the bias voltage provided to the gate or base terminals of the first and second transistors such that the first and second load-connection impedances associated with the first and second transistors, respectively, are lower in impedance than the impedances of the first and second supply-connection impedances, respectively.

The differential voltage-to-current conversion circuitry may comprise a first current sink connected to the first load node so as to draw a first sink current from the first load node, and a second current sink connected to the second load node so as to draw a second sink current from the second load node.

The first and second lead currents may comprise respective component currents of the differential current signal superimposed on a load bias current. The first and second current sinks may be controllable current sinks. The control circuitry may be configured to control the load bias currents by controlling the first and second sink currents.

The control circuitry may be configured to control the first and second sink currents so as to regulate the load bias currents at a target bias current value, or so as to compensate for changes in the drain or collector currents of the first and second transistors due to changes in the bias voltages provided to the gate or base terminals of the first and second transistors.

The control circuitry may be configured to adjust the target bias current value based on a control input signal.

The first and second supply-connection impedances may be implemented as resistors. The first and second supply-connection impedances may have the same impedance (e.g. resistance) as one another. The first and second input-connection impedances may be implemented as resistors. The first and second input-connection impedances may have the same impedance (e.g. resistance) as one another.

According to an embodiment of a second aspect of the present invention, there is provided analogue-to-digital conversion circuitry operable to generate a digital output signal based upon an analogue input differential current signal, wherein: the analogue-to-digital conversion circuitry comprises differential voltage-to-current conversion circuitry according to the aforementioned first aspect of the present invention; and the differential voltage-to-current conversion circuitry is configured to generate the input differential current signal as said differential current signal dependent on the differential input voltage signal.

According to an embodiment of a third aspect of the present invention, there is provided integrated circuitry, such as an IC chip, comprising differential voltage-to-current conversion circuitry according to the aforementioned first aspect of the present invention, or analogue-to-digital conversion circuitry according to the aforementioned second aspect of the present invention.

The present invention extends to method or computer program aspects (e.g. for control) corresponding to the apparatus (circuitry) aspects.

Reference will now be made, by way of example only, to the accompanying Figures, of which:

FIG. 1A, considered above, is a schematic circuit diagram of a multiphase current-mode sampler;

FIG. 1B, is a schematic circuit diagram of a multiphase current-mode sampler corresponding to FIG. 1A but using PMOS transistors;

FIG. 2, considered above, shows schematic waveforms useful for understanding the sampler of FIG. 1A;

FIG. 3, considered above, is a schematic circuit diagram of an example implementation of the FIG. 1A sampler;

FIG. 5 is an equivalent circuit diagram of the conversion circuitry of FIG. 4;

FIG. 8 is a schematic diagram of a circuitry system comprising the FIG. 4 circuitry.

FIG. 4 is a schematic diagram of differential voltage-to-current conversion circuitry 200 shown receiving a differential input voltage signal and outputting a corresponding differential current signal to load circuitry 300.

The conversion circuitry 200 is shown effectively drawing the current from a power supply voltage source VDDH (VDD High) with that current being sinked to a ground (GND) power supply voltage source via the load circuitry 300 (which has its own supply voltage source VDDL or VDD Low, where VDDH>VDDL). However, the reverse situation is also possible, with the current effectively flowing down from VDD (e.g. VDDH) through the load circuitry 300 and then through the conversion circuitry 200.

Figure 1A:
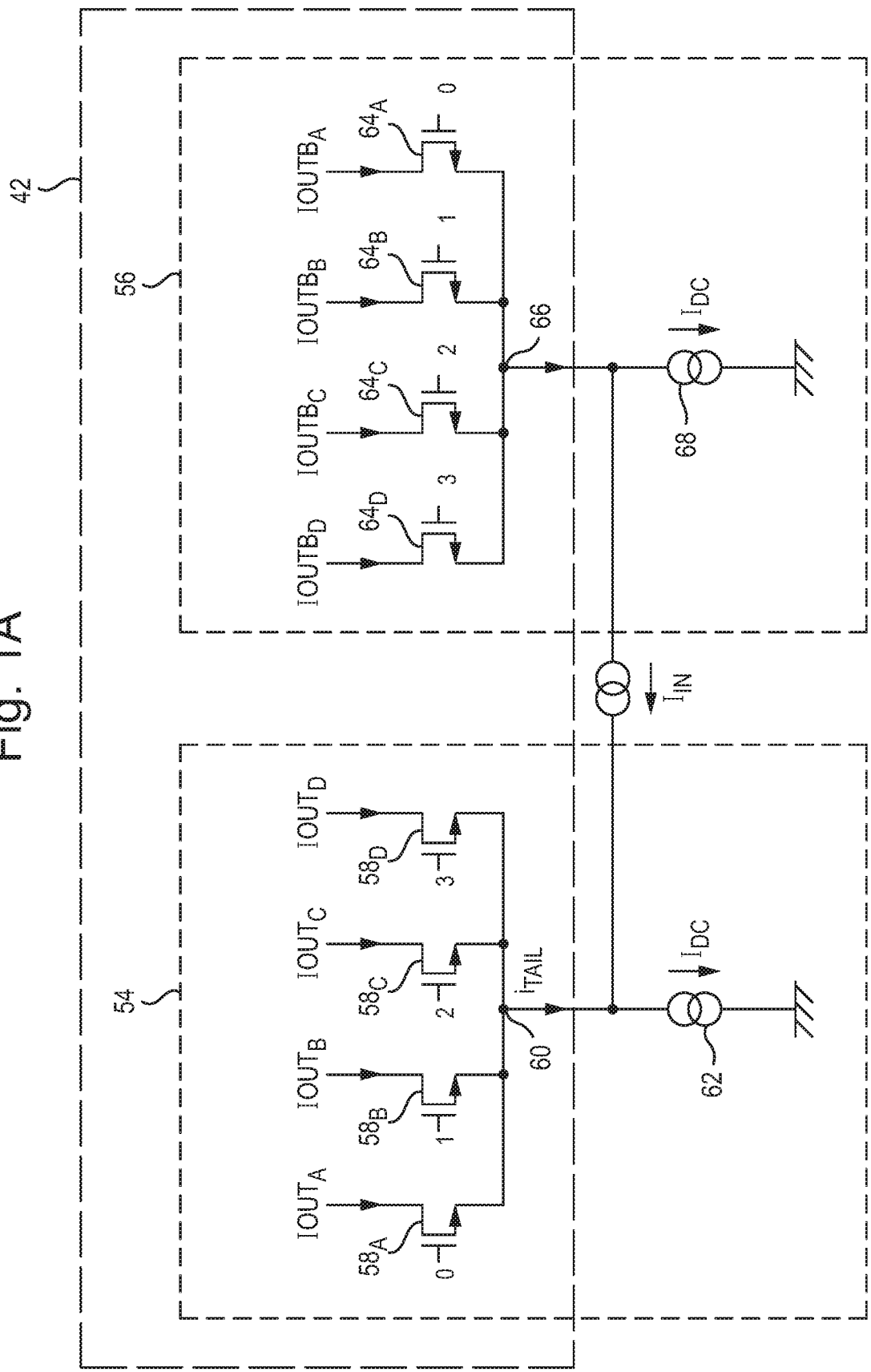

This latter case may indeed seem more appropriate given the direction of current flow through the tail nodes 60 and 66 from the switching transistors 58 and 64 in the sampler 42 of FIG. 1A.

Figure 1B:
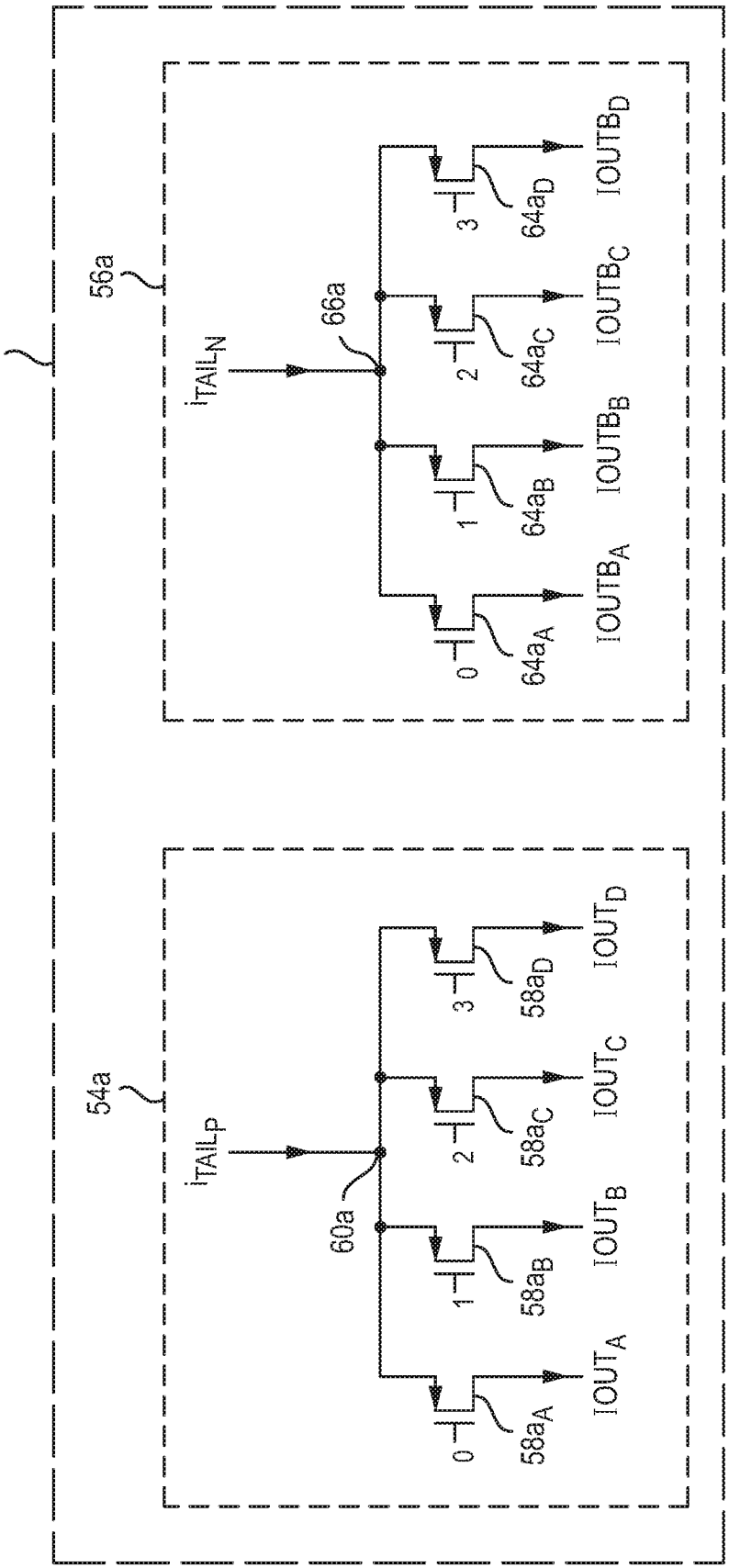
Figure 2:
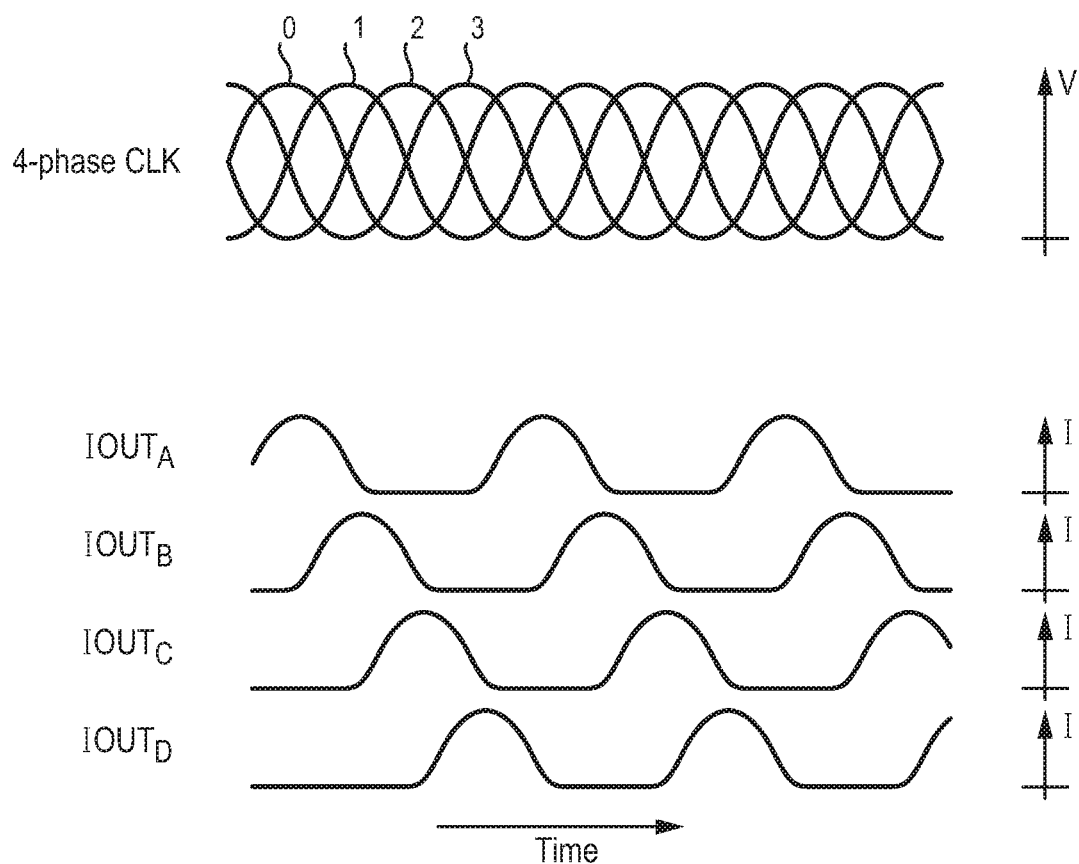
Figure 3:
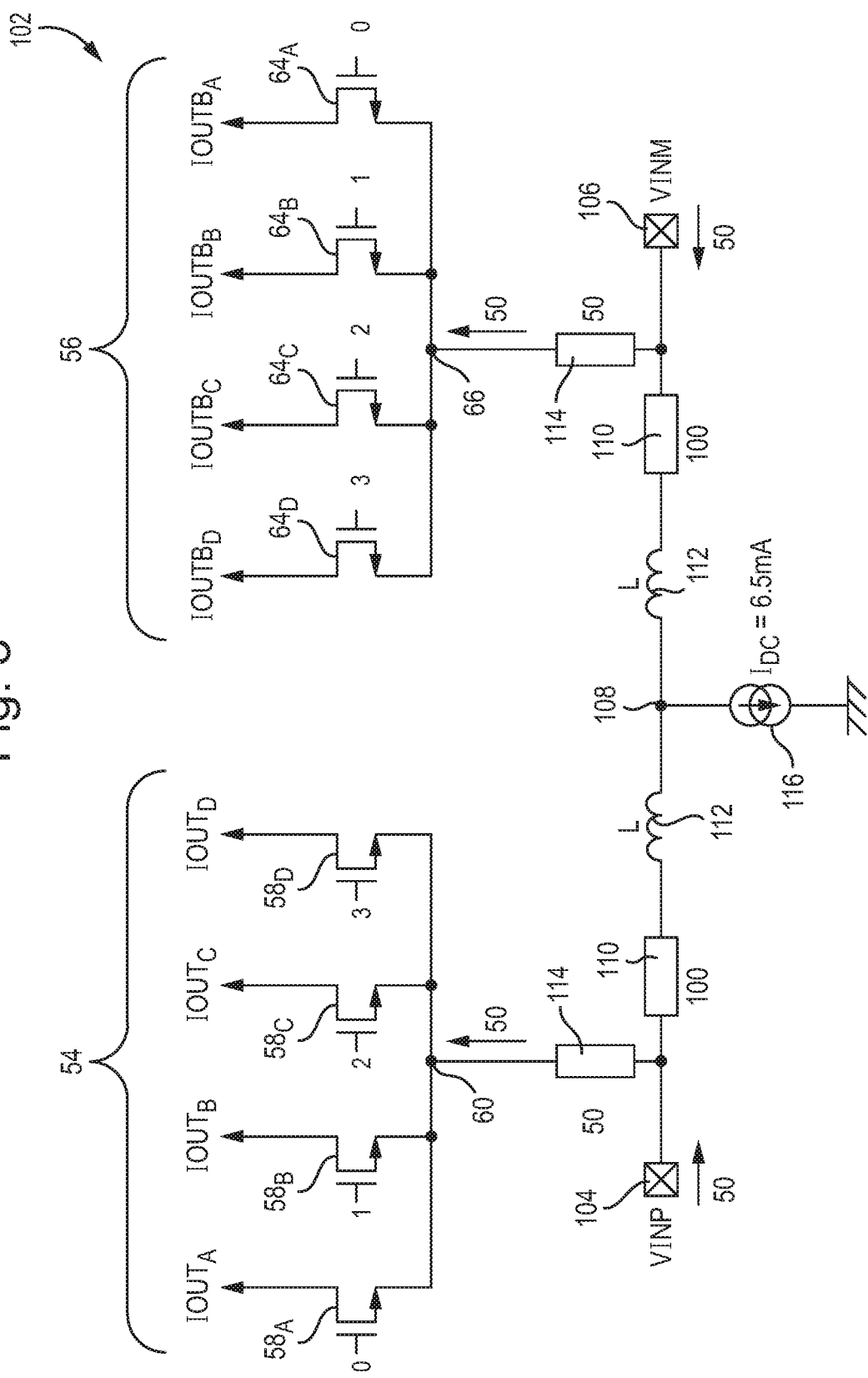

However, equally, the sampler 42 general configuration could provided effectively the other way up as shown in FIG. 1B by way of sampler 42a which corresponds to sampler 42. Sampler 42a sinks currents at the corresponding tail nodes 60a and 66a from the conversion circuitry 200 and passes them through the corresponding switching transistors 58a and 64a towards ground (GND) (being the case which aligns with that depicted in FIG. 4). The sampler 42a receive currents at the tail nodes 60a and 66a from the FIG. 4 conversion circuitry 200 (nodes 206 and 210) and passes them through the switching transistors 58a and 64a towards the ADC's sampling capacitors (not shown) effectively serving as a virtual GND.

It will thus be understood that the sampler 42a—and ADC circuitry comprising the sampler 42a—may serve as the load circuitry 300. As such, the conversion circuitry 200 may be considered front-end circuitry for the sampler 42a and ADC circuitry comprising the sampler 42a. The present disclosure will be understood accordingly.

Figure 4:
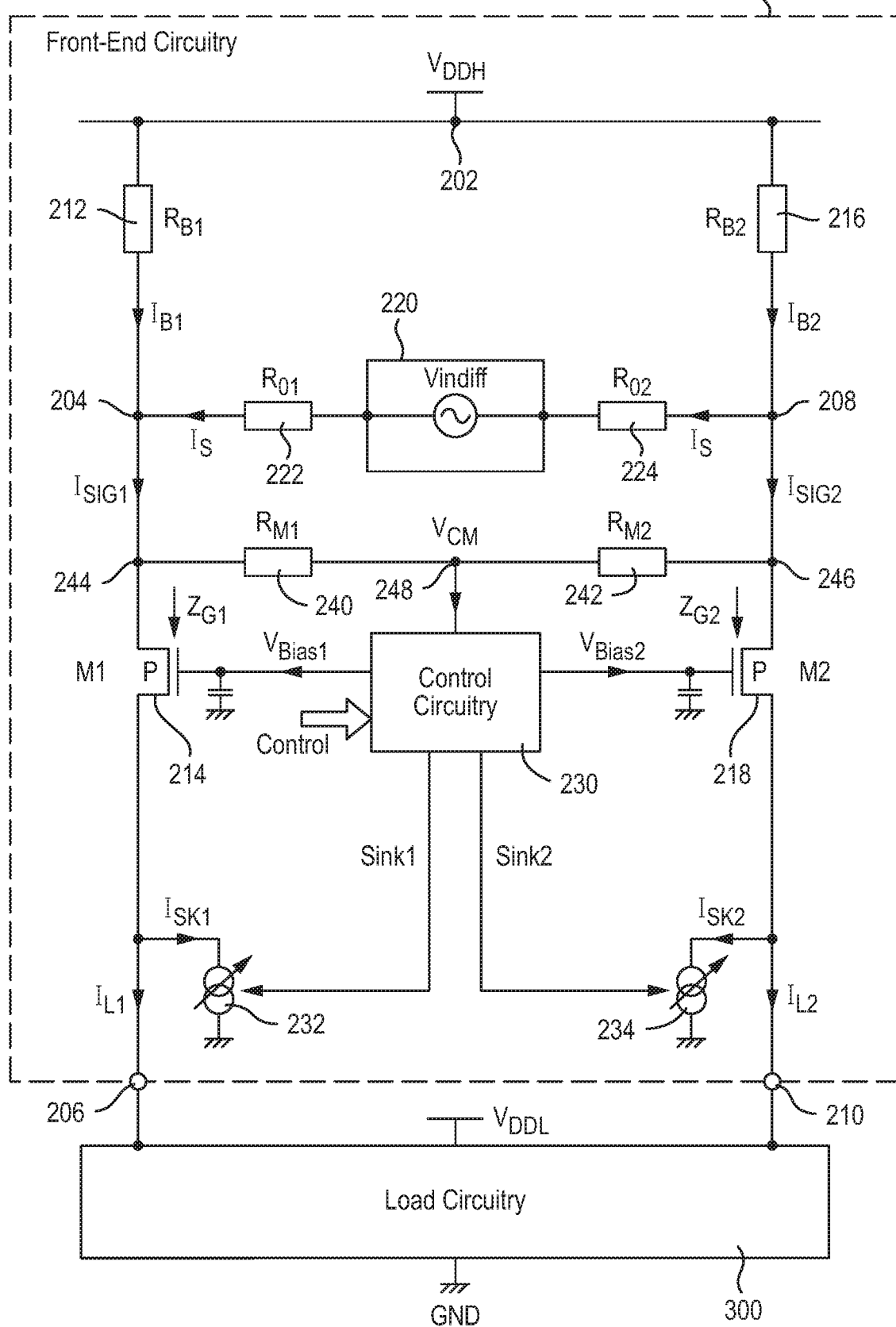
FIG. 4 is a schematic diagram of differ voltage-to-current conversion circuitry embodying the present invention.

The conversion circuitry 200 comprises a first (e.g. "plus") current path extending from a power supply voltage node 202 at VDDH (VDD High) via a first intermediate node 204 to a first load node 206 to provide a first load current $I_{L1}$ at the first load node 206 for use by the load circuitry 300 when it is connected to the first load node 206 as in FIG. 4. The conversion circuitry 200 also comprises a second (e.g. "minus") current path extending, in parallel with the first current path, from the power supply voltage node 202 via a second intermediate node 208 to a second load node 210 to provide a second load current $I_{L2}$ at the second load node 210 for use by the load circuitry 300, again when it is connected to the second load node 210 as in FIG. 4.

The first and second load currents $I_{L1}$ and $I_{L2}$ may thus be considered as "plus" and "minus" component currents of a differential current signal provided by the conversion circuitry 200 to the load circuitry 300.

A first supply-connection impedance 212 is connected along the first current path between the power supply node 202 and the first intermediate node 204, and a first load-connection impedance 214 is connected along the first current path between the first intermediate node 204 and the first load node 206. Similarly, a second supply-connection impedance 216 is connected along the second current path between the power supply node 202 and the second intermediate node 208, and a second load-connection impedance 218 is connected along the second current path between the second intermediate node 208 and the second load node 210.

The first and second supply-connection impedances 212 and 216 are implemented as resistors having resistances $R_{B1}$ and $R_{B2}$, respectively. The first and second-connection impedances 214 and 218 are both implemented as transistors, in this case as PMOS MOSFETs M1 and M2, respectively, in a common gate configuration so that they present input impedances $Z_{G1}$ and $Z_{G2}$, respectively, which can be controlled by gate bias voltages $V_{BIAS1}$ and $V_{BIAS2}$, respectively. Optional smoothing capacitors are shown at their gate terminals. The bias voltages are bias voltages in the sense that they are stable or effectively DC voltages, independent of the differential input voltage signal Vindiff. It will become apparent that, although not necessary, the transistors 214 and 218 are configured (e.g. in terms of transistor size) in the same way as one another and are controlled in the same way (e.g. with $V_{BIAS1}=V_{BIAS2}$) so that $Z_{G1}=Z_{G2}$.

A differential voltage input 220 is connected between the first and second intermediate nodes 204 and 208 via first and second input-connection impedances 222 and 224, respectively, for application of a differential input voltage signal Vindiff, supplied at the differential voltage input 220, between the first and second input-connection impedances 222 and 224 as shown in FIG. 4. Thus, the first and second load currents $I_{L1}$ and $I_{L2}$, which define the differential current signal, are dependent on the differential input voltage signal Vindiff. The first and second input-connection impedances 222 and 224 are implemented as resistors having resistances $R_{O1}$ and $R_{O2}$, respectively.

Looking at FIG. 4, it is assumed that bias currents $I_{B1}$ and $I_{B2}$ flow through resistors 212 and 216, respectively, that current $I_S$ flows from intermediate node 208 to intermediate node 204 dependent on the differential input voltage signal Vindiff, that signal currents $I_{SIG1}$ and $I_{SIG2}$ flow through transistors 214 and 218, respectively, and that currents $I_{L1}$ and $I_{L2}$ are provided at load nodes 206 and 210, respectively. The bias currents are bias currents in that they are stable or DC currents, independent of the differential input voltage signal Vindiff. Further, sink currents $I_{SK1}$ and $I_{SK2}$ (to be described later) are drawn from the drain terminals of the transistors 214 and 218, respectively. Thus, $I_{SIG1}=I_{B1}+I_S$ and $I_{SIG2}=I_{B2}-I_S$. Further, $I_{L1}=I_{SIG1}-I_{SK1}$; and $I_{L2}=I_{SIG2}-I_{SK2}$.

Control circuitry 230 is provided to control the bias voltages $V_{BIAS1}$ and $V_{BIAS2}$, since this has the effect of controlling the gain relationship between the differential input voltage signal Vindiff and the differential current signal. In this regard, controlling the bias voltages $V_{BIAS1}$ and $V_{BIAS2}$ controls the impedance values $Z_{G1}$ and $Z_{G2}$, respectively. The significance of this can be better appreciated through consideration of FIG. 5, which presents an equivalent circuit diagram 200-E of the conversion circuitry 200 of FIG. 4.

In FIG. 5, like components are denoted with like reference signs for ease of comparison with FIG. 4, and duplicate description is omitted. For simplicity, and symmetry/balance in the operation, it is assumed in FIGS. 4 and 5 that the first and second current paths are configured in the same way as one another, and in particular that $R_{B1}=R_{B2}=R_B$, $R_{O1}=R_{O2}=R_O$, and that $Z_{G1}=Z_{G2}=Z_G$ (in terms of their common-mode value). Thus, it is also assumed that $I_{B1}=I_{B2}=I_B$. It is also assumed that $I_{SK1}=I_{SK2}=I_{SK}$.

As an overview, the front-end circuitry (conversion circuitry 200) exhibits highly linear voltage-to-current conversion, highly efficient signal power conversion by means of highly-controlled input impedance, direct signal current feedthrough from the first and second current paths to the subsequent load circuitry (e.g. through the switching transistors 58 and 64 of the sampler 42), and adjustable gain of the swing of the differential input voltage signal Vindiff to the swing of the differential current signal.

Looking at FIG. 5, Vindiff is the differential input voltage signal applied o the circuit via input-connection resistors 222 and 224 to the first current path ("plus" or P-branch) and the second current path ("minus" or N-branch) as in FIG. 4. In order to maximize the effective signal current '$i_S$', the active stage input impedance $Z_G$ (i.e. associated with the transistors 214 and 218) is dimensioned to be much smaller than the bias resistance $R_B$ through which the effective bias current '$i_S$' flows. Furthermore it is possible to vary the loop current ratio $i_S/i_B$ and therefore the gain of the transfer function $i_S$=f(Vindiff) can be adjusted.

The transfer function calculates to:

$$i_s = \frac{R_B}{Z_G + R_B} \cdot \frac{Vindiff}{R_0 + \frac{R_B Z_G}{R_B + Z_G}}$$

It can be appreciated that if $Z_G \ll R_B$, then the transfer function simplifies to:

$$i_s = \frac{Vindiff}{R_0 + Z_G}$$

Varying impedance $Z_G$ then leads to slight adjustments of the gain of the transfer function.

In order to realize a low impedance $Z_G$ in FIG. 4, the transistors 214 and 218 (M1, M2) form a common gate stage. This stage is biased and dimensioned in a way to have a very low input impedance (i.e. $Z_G \ll R_B$) and a very high output impedance providing the subsequent load circuitry 300 with a bias current on which is superimposed a differential signal current (the two together constituting the current components—i.e. the load currents—of the overall differential current signal). This current is highly proportional to the differential input voltage signal Vindiff. Therefore the subsequent load circuitry 300 can be treated low-ohmic and it does not affect signal power-to-current conversion.

The impedance $Z_G \sim 1/gm$ proportional to $\approx 1/\sqrt{I_D}$, where $I_D$ is the drain current and gm is the transconductance of the transistors. Thus, the impedance $Z_G$ can be controlled by controlling the common mode value of the drain current $I_D$ (effectively by controlling the bias current $I_B$), i.e. by controlling the gate-source voltages of the transistors 214 and 218 by controlling the bias voltages $V_{BIAS1}$ and $V_{BIAS2}$ as mentioned above. In the present embodiment, the bias current $I_B$ (recall that $I_{B1}=I_{B2}=I_B$ in FIG. 4) is regulated by means of common gate bias $V_{BIAS}$ (recall that $V_{BIAS1}=V_{BIAS2}=V_{BIAS}$ in FIG. 4) using bias circuitry containing a voltage regulator and current DAC (as considered later in connection with FIG. 6A).

Furthermore $Z_G$=1/gm can be adjusted by programmable or other control of the bias current $I_B$ (i.e. by adjusting the $V_{BIAS}$ gate signals) while keeping the output signal current unaffected by means of adding programmable/controllable current sinks 232 and 234 to draw sink currents $I_{SK1}$ and $I_{SK2}$ (recall that $I_{SK1}=I_{SK2}=I_{SK}$ in FIG. 4) at the drain terminals of the transistors 214 and 218 as shown in FIG. 4. The current sinks 232 and 234 may then be biased (controlled, e.g. being programmable) by way of control signals SINK1 and SINK2 (assume that SINK1=SINK2=SINK), i.e. such that the difference between the bias current 1B and the sink current $I_{SK}$ (being $I_L$) is regulated (e.g. unaffected by changes in the bias current $I_B$). This regulation can be done in an automatic control loop, as considered later in connection with FIGS. 6B and 7. The control may also be such that the value of the difference between the bias current $I_B$ and the sink current $I_{SK}$ can be varied to vary the amount of current supplied to the load circuitry 300, for example to optimize the operation of the load circuitry 300. This will also be considered later in connection with FIGS. 6B and 7.

Returning to FIG. 4, the control circuitry 230 is configured to receive a control signal CONTROL, and based on that signal to generate the control signals $V_{BIAS1}$, $V_{BIAS2}$, SINK1 and SINK2. The control circuitry 230 is also configured to receive a common-mode voltage $V_{CM}$ being representative of the common-mode value of the source voltages of the transistors 214 and 218. Measurement impedances 240 and 242 are connected in series between the source terminals 244 and 246 of the transistors 214 and 218, respectively, and the $V_{CM}$ signal is taken from a node 248 between the measurement impedances 240 and 242. The measurement impedances 240 and 242 are implemented as resistors having resistances $R_{M1}$ and $R_{M2}$, respectively. It is assumed that $R_{M1}=R_{M2}$.

Figure 6A:
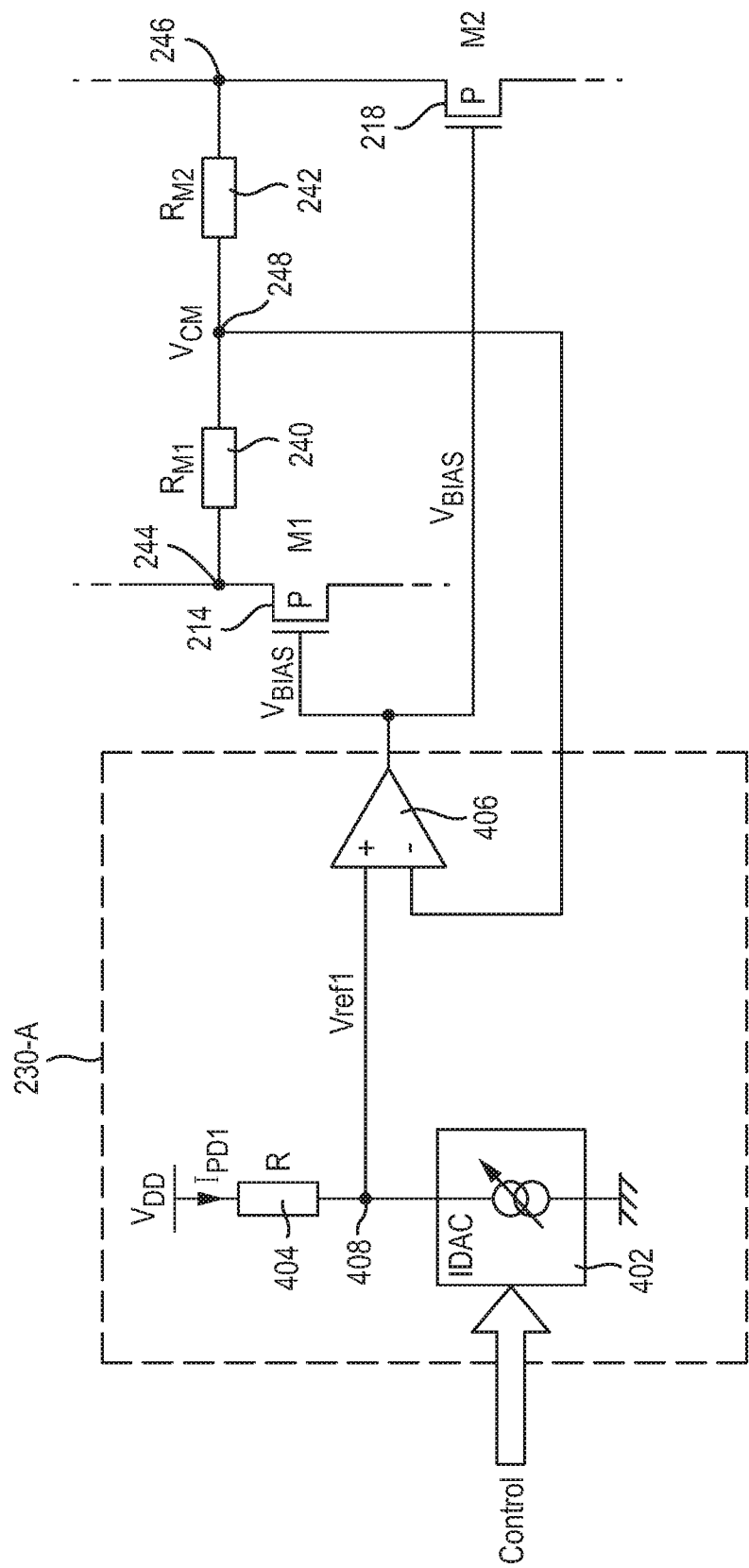
FIG. 6A is a schematic diagram useful for understanding one way of regulating the bias current in FIG. 4.

FIG. 6A is a schematic diagram which, as mentioned above, is useful for understanding one way of regulating the bias current $I_B$ (recall that $I_{B1}=I_{B2}=I_B$ in FIG. 4) by means of common gate bias $V_{BIAS}$ (recall that $V_{BIAS1}=V_{BIAS2}=V_{BIAS}$ in FIG. 4) using bias circuitry.

For ease of understanding, parts of the conversion circuitry 200 containing the transistors 214 and 218 are presented, with the other parts of the conversion circuitry 200 being omitted for simplicity. A part 230-A of the control circuitry 230 is shown, comprising a current DAC (Digital-to-Analogue Converter) or DAC 402, a resistor 404 and a differential amplifier 406 (e.g. an operational amplifier).

The IDAC 402 is connected in series with the resistor 404 between VDD (e.g. VDDH) and GND to form a potential divider arrangement. The DAC 402 is controlled by part of the (digital) control signal CONTROL to cause a current $I_{PD1}$ to flow through the resistor 404 such that a desired reference voltage Vref1 is produced at a node 408 along the potential divider between the IDAC 402 and the resistor 404.

The differential amplifier 406 is connected to receive the reference voltage Vref1 and the common-mode voltage $V_{CM}$ at its input terminals, and to output the common gate bias $V_{BIAS}$ based upon a difference between the reference voltage Vref1 and the common-mode voltage $V_{CM}$. The differential amplifier 406 controls or regulates the common gate bias $V_{BIAS}$ such that it tends towards the reference voltage Vref1 at which the difference between the reference voltage Vref1 and the common-mode voltage $V_{CM}$ is minimized. This has the effect of regulating the bias current $I_B$. The control signal CONTROL can thus be adjusted to adjust the reference voltage Vref1 and therefore the bias current $I_B$. This enables digital (programmable) control of the bias current $I_B$.

Figure 6B:
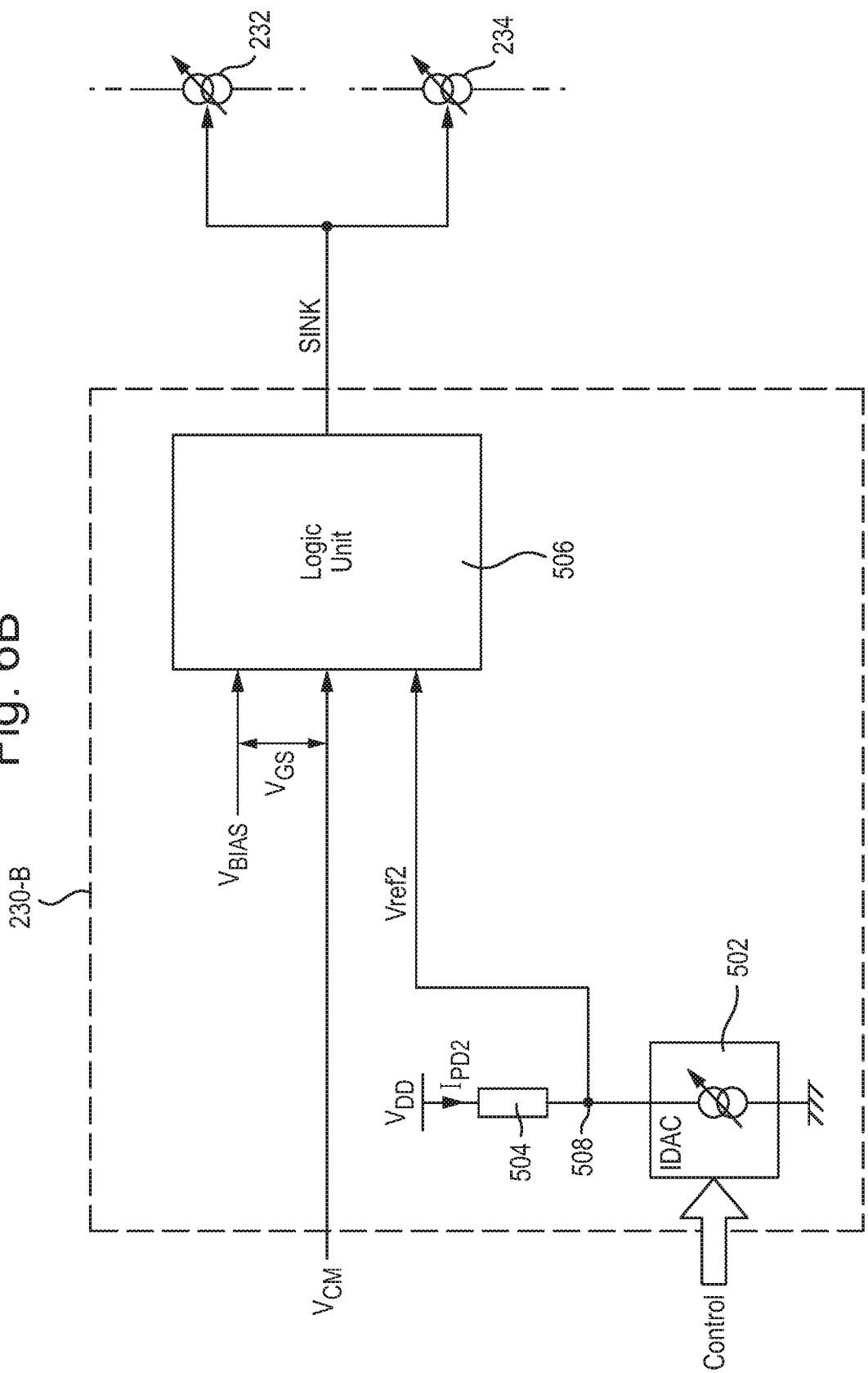
FIG. 6B is a schematic diagram useful for understanding one way of biasing the current sinks in FIG. 4.

FIG. 6B is a schematic diagram which, as mentioned above, is useful for understanding one way of biasing the current sinks 232 and 234 by way of control signals SINK1 and SINK2 (assume that SINK1=SINK2=SINK) such the sink current $I_{SK}$ compensates for changes in the bias current $I_B$, i.e. such that the difference between the bias current $I_B$ and the sink current $I_{SK}$ is regulated (e.g. unaffected by changes in the bias current $I_B$). As also mentioned above, the control may be such that the value of the difference between the bias current $I_B$ and the sink current $I_{SK}$ can be varied to vary the amount of current supplied to the load circuitry 300, for example to optimize the operation of the load circuitry 300.

For ease of understanding, parts of the conversion circuitry 200 containing the current sinks 232 and 234 are presented, with the other parts of the conversion circuitry 200 being omitted for simplicity. A part 230-B of the control circuitry 230 is shown, comprising an IDAC 502, a resistor 504 and a logic unit 506 (which may be implemented as a processor executing a computer program).

The IDAC 402 is connected in series with the resistor 404 between VDD (e.g. VDDH) and GND to form a potential divider arrangement. The IDAC 502 is controlled by part of the (digital) control signal CONTROL to cause a current $I_{PD2}$ to flow through the resistor 404 such that a desired reference voltage Vref2 is produced at a node 508 along the potential divider between the IDAC 502 and the resistor 504.

The logic unit 506 is connected to receive the reference voltage Vref2, the common-mode voltage $V_{CM}$ and the common gate bias $V_{BIAS}$ (generated by part 230-A of the control circuitry 230) at its input terminals, and to output the control signal SINK based on those input signals.

The common-mode voltage $V_{CM}$ and the common gate bias $V_{BIAS}$ together give a measure of the common-mode gate-source voltage $V_{GS}$ of the transistors 214 and 218, as indicated in FIG. 6B. The common gate bias $V_{BIAS}$ itself may also be considered a measure of the common-mode gate-source voltage $V_{GS}$ of the transistors 214 and 218 in which case the common-mode voltage $V_{CM}$ need not be supplied to the logic unit 506. The measure of the common-mode gate-source voltage $V_{GS}$ of the transistors 214 and 218 is taken as a measure of the bias current $I_B$ (i.e. the common mode drain current $I_D$). The reference voltage Vref2 is taken as a measure of a target bias current $I_T$ (i.e. a target common mode drain current $I_D$). The logic unit 506 then adjusts the control signal SINK so that the bias current $I_B$ tends towards or is regulated at the target bias current $I_T$.

The control signal CONTROL can thus be adjusted to adjust the reference voltage Vref2 and therefore the target bias current $I_T$. This enables digital (programmable) control of the target bias current $I_T$, and thus of the difference between the bias current $I_B$ and the sink current $I_{SK}$. Thus, if the control signal CONTROL is maintained the same in respect of the target bias current $I_T$, then the difference between the bias current $I_B$ and the sink current $I_{SK}$ is regulated to that value. By adjusting the control signal CONTROL in respect of the target bias current $I_T$, i.e. adjusting the reference voltage Vref2, the control may be such that the value of the difference between the bias current $I_B$ and the sink current $I_{SK}$ can be varied to vary the amount of current supplied to the load circuitry 300.

Incidentally, although the bias current $I_B$ here is defined as that following through the transistors 214 and 218 (i.e. prior to the drawing of current $I_{SK}$ by the current sinks 232 and 234), there could also be considered to be a load bias current $I_{BL}$ which forms part of the load currents $I_L$, where $I_{BL}=I_B-I_{SK}$. Thus, it could be considered that the control based on Vref2 serves to control the sum of the load bias current $I_{BL}$ and the sink current $I_{SK}$.

Figure 7:
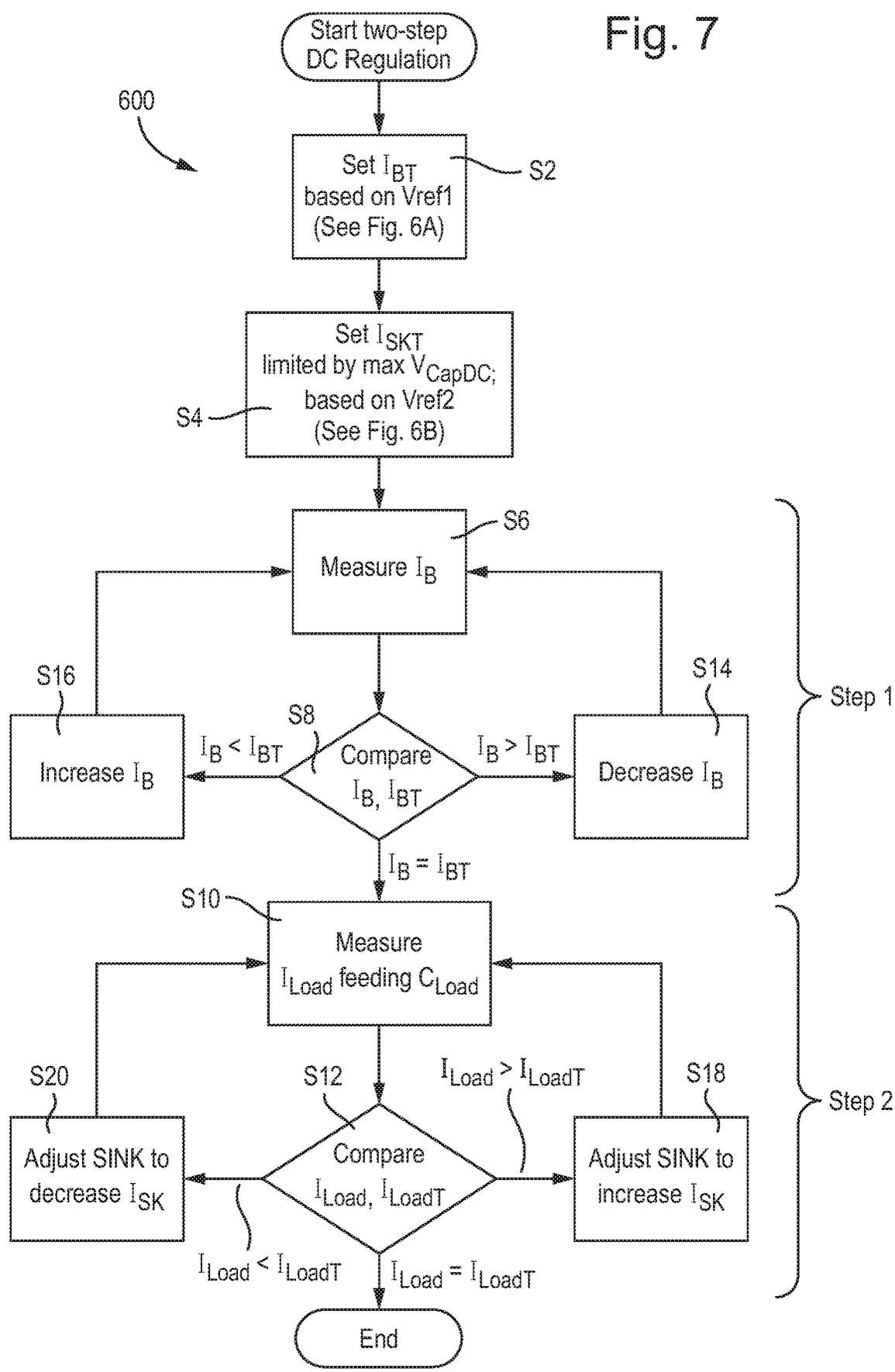
FIG. 7 is a flow diagram of an example method useful for understanding the operation of the logic unit of FIG. 6B.

FIG. 7 is a flow diagram of example method 600 useful for understanding the operation of the logic unit 506 and in addition takes into account a possible logic operation which is more sophisticated than the corresponding operation of the differential amplifier 406 (it will be appreciated that the amplifier 406 could be replaced with a logic unit operating in accordance with the relevant steps of method 600). Method 600 has steps S2 to S20.

In overview, method 600 is a two-step DC regulation scheme, comprising overall Steps 1 and 2 as indicated. Step 1 (corresponding to the operation in FIG. 6A) is for optimization of the input impedance $Z_G$ by adjustment of bias current $I_B$ (by adjusting the $V_{BIAS}$ gate signals) through control of target value $I_{BT}$. Step 2 (corresponding to the operation in FIG. 6B) if for optimization of the DC load current $I_L$ (which is $I_{L1}$, $I_{L2}$ in FIG. 4 and shown as $I_{LOAD}$ in FIG. 7) with respect to a maximum voltage range $V_{CapDC}$ on a sampling capacitor $C_{Load}$ by adjustment of sink current $I_{SK}$ to a target value of the load current $I_{LoadT}$.

Here, the sampling capacitor $C_{Load}$ may be consider to be at the end of each of the paths shown in FIG. 1B (e.g. to be charged up by the current $IOUT_A$ within the sampling frequency fSampling to values $V_{CapDC}$—see below).

In step S2, a value of the target bias current $I_{BT}$ is set based on the reference voltage Vref1 (see FIG. 6A) to optimize input impedance $Z_G$. The method then proceeds to step S4 in which the target sink current $I_{SKT}$ is set based on Vref2 (see FIG. 6B) to optimize operating range on sampling capacitor $C_{LOAD}$. Two constraints exist to set this current:

Constraint 1: $I_{Load,min}=I_{L1}$,min, $I_{L2}$,min>0 (refer to FIG. 4)

Constraint 2: $V_{CapDC}$<VDDL (maximum charge on sampling capacitor $C_{Load}$)

This leads to the following condition for the target sink current $I_{SKT}$:

$$I_{BT}+I_{S,max}-\text{VDDL}*f\text{Sampling}*C_{Load}<I_{SKT}<I_{BT}-I_{S,max}$$

where:

$I_{S,max}$ is the maximum signal DC current;
$V_{CapDC}$ is the voltage on the sampling capacitor $C_{LOAD}$;
$C_{LOAD}$ is the sampling capacitor within the load circuitry 300, which is charged to a target DC voltage of $V_{CapDC}$ within the sampling time 1/fSampling; and
fSampling is the sampling frequency.

The method then proceeds to step S6 in which the existing bias current $I_B$ is measured based on $V_{GS}$. Recall that the common-mode voltage $V_{CM}$ and the common gate bias $V_{BIAS}$ together give a measure of the common-mode gate-source voltage $V_{GS}$ of the transistors 214 and 218, as indicated in FIG. 6B. The method then proceeds to step S8.

In step S8 it is determined whether the existing bias current $I_B$ is greater than the target bias current $I_{BT}$. If it is (step S8, $I_B>I_{BT}$), the method proceeds to step S14. Otherwise (step S8, $I_B<I_{BT}$), the method proceeds to step S16. In step S14 the $V_{BIAS1,2}$ signals are controlled to both decrease the bias current $I_B$ to or towards the target value $I_{BT}$. In step S16 the $V_{BIAS1,2}$ signals are controlled to both increase the bias current $I_B$ to or towards the target value $I_{BT}$.

If the measured value $I_B$ equals the target value $I_{BT}$ the method proceeds with step S10. The correct value of $I_B$ is desireable to optimize the input impedance of $Z_{G1}$, $Z_{G2}$.

In step S10 the existing load current $I_{LOAD}$ ($I_L$) feeding load capacitors in the subsequent load circuitry 300 (ADC stage) is measured. The method then proceeds to step S12.

In step S12 it is determined whether the existing load current $I_{LOAD}$ is greater than the target load current $I_{LoadT}$. If it is (step S12, $I_{LOAD}>I_{LoadT}$), the method proceeds to step S18. Otherwise (step S12, $I_{LOAD} < I_{LoadT}$), the method proceeds to step S20. In step S18 the SINK signals are controlled to increase the sink currents $I_{SK}$ to bring the load currents $I_{LOAD}$ to or towards the target value $I_{LoadT}$. In step S20 the SINK signals are controlled to decrease the sink currents $I_{SK}$ to bring the load currents $I_{LOAD}$ to or towards the target value $I_{LoadT}$. If the measured value $I_{LOAD}$ equals the target value $I_{LoadT}$ the method ends. The correct value of $I_{LOAD}$ is desireable to optimize the operating voltage range on the sampling capacitor $C_{LOAD}$.

Either way, the method 600 then continues until operation is stopped—for example if it is determined that the $V_{BIAS}$ and SINK signals have optimal values which need not be changed for the time being. Thus, the method 600 may be run from time to time. The logic unit 506 (along with a corresponding unit replacing amplifier 406) may be implemented in software running on a processor or in analogue circuitry.

FIG. 8 is a schematic diagram of a circuitry system 700, comprising the conversion (or front-end) circuitry 200 and the load circuitry 300 coupled together as in FIG. 4.

Thus, the conversion circuitry 200 receives a differential input voltage signal Vindiff and outputs a corresponding differential current signal as the input differential current signal Iindiff for the load circuitry 300.

As indicated in FIG. 8, the load circuitry 300 may be ADC circuitry configured based on the sampler 42a (see FIG. 1B) and explained in more detail in EP-A1-2211468 to generate a digital output signal as shown in FIG. 8 based on the input differential current signal Iindiff. Thus, the circuitry system 700 could be referred to as ADC circuitry. Further, the conversion (or front-end) circuitry 200 and the load circuitry 300 could both be implemented as integrated circuitry, provided for example on an IC chip. Thus, the circuitry system 700 could be referred to as integrated circuitry, and may be provided on or as a single IC chip.

It will incidentally be appreciated that the MOSFET or FET transistors 214 and 218 could instead be BJTs, and the present disclosure will be understood accordingly.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, Internet fiber-optic networks and wireless networks) and network equipment of such networks, comprising such circuit boards.

In any of the above method aspects, the various features may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

Further embodiments may be provided within the spirit and scope of the present invention as disclosed herein.

The invention claimed is:

1. A differential voltage-to-current conversion circuitry, comprising:
   a power supply node for connection to a power supply voltage source;
   a first current path extending from the power supply node via a first intermediate node to a first load node to provide a first load current at the first load node for use by load circuitry when connected to the first load node, wherein a first supply-connection impedance is connected along the first current path between the power supply node and the first intermediate node and a first load-connection impedance is connected along the first current path between the first intermediate node and the first load node;
   a second current path extending, in parallel with the first current path, from the power supply node via a second intermediate node to a second load node to provide a second load current at the second load node for use by the load circuitry when connected to the second load node, wherein a second supply-connection impedance is connected along the second current path between the power supply node and the second intermediate node and a second load-connection impedance is connected along the second current path between the second intermediate node and the second load node;
   a differential voltage input connected between the first and second intermediate nodes via first and second input-connection impedances, respectively, for application of a differential input voltage signal, supplied at the differential voltage input, between the first and second input-connection impedances so that the first and second load currents together define a differential current signal dependent on the differential input voltage signal;
   a first current sink connected to the first load node so as to draw a first sink current from the first load node;
   a second current sink connected to the second load node so as to draw a second sink current from the second load node; and
   control circuitry,
   wherein:
   the first and second load-connection impedances are implemented as first and second transistors, respectively;
   the control circuitry is configured to control a bias voltage provided to the gate or base terminals of the first and second transistors so as to control a gain relationship between the differential input voltage signal and the differential current signal;
   the first and second load currents comprise respective component currents of the differential current signal superimposed on a load bias current;
   the first and second current sinks are controllable current sinks; and
   the control circuitry is configured to control the load bias currents by controlling the first and second sink currents.

2. The differential voltage-to-current conversion circuitry as claimed in claim 1, wherein the control circuitry is configured to control the bias voltage provided to the gate or base terminals of the first and second transistors based on a common-mode voltage indicative of a common mode between the source or emitter voltages of the first and second transistors.

3. The differential voltage-to-current conversion circuitry as claimed in claim 2, wherein the control circuitry comprises first and second measurement impedances connected in series between the source or emitter terminals of the first and second transistors, and is configured to obtain the common-mode voltage from a node between the first and second measurement impedances.

4. The differential voltage-to-current conversion circuitry as claimed in claim 3, wherein:
the first and second measurement impedances are implemented as resistors; or
the first and second measurement impedances have the same impedance as one another.

5. The differential voltage-to-current conversion circuitry as claimed in claim 2, wherein the control circuitry is configured to control the bias voltage provided to the gate or base terminals of the first and second transistors based on a difference between the common-mode voltage and a target voltage.

6. The differential voltage-to-current conversion circuitry as claimed in claim 1, wherein the control circuitry is configured to control the bias voltage provided to the gate or base terminals of the first and second transistors such that the first and second load-connection impedances associated with the first and second transistors, respectively, are lower in impedance than the impedances of the first and second supply-connection impedances, respectively.

7. An integrated circuitry comprising the differential voltage-to-current conversion circuitry of claim 1.

8. The integrated circuitry of claim 7, wherein the integrated circuitry is an IC chip.

9. The differential voltage-to-current conversion circuitry as claimed in claim 1, wherein:
the control circuitry is configured to control the first and second sink currents so as to regulate the load bias currents at a target bias current value, or so as to compensate for changes in the drain or collector currents of the first and second transistors due to changes in the bias voltages provided to the gate or base terminals of the first and second transistors.

10. The differential voltage-to-current conversion circuitry as claimed in claim 9, wherein the control circuitry is configured to adjust the target bias current value based on a control input signal.

11. The differential voltage-to-current conversion circuitry as claimed in claim 1, wherein:
the first and second supply-connection impedances are implemented as resistors; or
the first and second supply-connection impedances have the same impedance as one another; or
the first and second input-connection impedances are implemented as resistors; or
the first and second input-connection impedances have the same impedance as one another.

12. An analogue-to-digital conversion circuitry operable to generate a digital output signal based upon an analogue input differential current signal, wherein:
the analogue-to-digital conversion circuitry comprises the differential voltage-to-current conversion circuitry of claim 1; and
the differential voltage-to-current conversion circuitry is configured to generate the input differential current signal as said differential current signal dependent on the differential input voltage signal.

13. An integrated circuitry comprising the analogue-to-digital conversion circuitry of claim 12.

14. The integrated circuitry of claim 13, wherein the integrated circuitry is an IC chip.

* * * * *